United States Patent [19]

Jacob et al.

[11] Patent Number: 4,505,782

[45] Date of Patent: Mar. 19, 1985

[54] PLASMA REACTIVE ION ETCHING OF ALUMINUM AND ALUMINUM ALLOYS

[75] Inventors: Adir Jacob; Daniel H. Chöe, both of Framingham, Mass.

[73] Assignee: LFE Corporation, Clinton, Mass.

[21] Appl. No.: 535,929

[22] Filed: Sep. 26, 1983

Related U.S. Application Data

[63] Continuation of Ser. No. 478,845, Mar. 25, 1983, abandoned.

[51] Int. Cl.$^3$ .................... C23F 1/02; C03C 15/00; C03C 25/06; B44C 1/22
[52] U.S. Cl. ............................ 156/643; 156/646; 156/656; 156/659.1; 156/665; 204/192 E; 252/79.1
[58] Field of Search ........ 252/79.1; 204/164, 192 EC, 204/192 E, 298; 427/38, 39; 156/643, 646, 656, 659.1, 665, 345

[56] References Cited

U.S. PATENT DOCUMENTS

| | | | |
|---|---|---|---|
| 4,030,967 | 6/1977 | Ingrey et al. | 156/643 |
| 4,213,818 | 7/1980 | Lemons et al. | 156/643 |
| 4,256,534 | 3/1982 | Levinstein et al. | 156/643 |
| 4,267,013 | 5/1981 | Iida et al. | 156/643 |
| 4,298,443 | 11/1981 | Maydan | 204/192 E |
| 4,352,724 | 10/1982 | Sugishima et al. | 204/192 E |
| 4,380,488 | 4/1983 | Reichelderfer et al. | 156/643 |
| 4,412,885 | 11/1983 | Wang et al. | 252/79.1 X |

OTHER PUBLICATIONS

Article entitled Mass Spectrometric Study of Plasma Etching by Bruce A. Raby, UTI, Sunnyvale, Calif., J. Vac. Sci. Technol. 15(2), Mar./Apr. 1978, pp. 205–208.
Article entitled Abstract: Mechanisms in Plasma Etching by J. W. Coburn and H. F. Winters, IBM Research Laboratory, San Jose, Calif., J. Vac. Sci. Technol. 15(2), Mar./Apr. 1978, pp. 327–328.
Article entitled Plasma Etching-A Discussion of Mechanisms by J. W. Coburn and Harold F. Winters, IBM Research Laboratory, San Jose, Calif., J. Vac. Sci. Technol. 16(2), Mar./Apr. 1979, pp. 391–403.
Article entitled Plasma Etching-A "pseudo-black-box" Approach by Harold F. Winters, J. W. Coburn, and E. Kay, IBM Research Laboratory, San Jose, Calif., J. Appl. Phys. 48(12), Dec. 1977, pp. 4973–4983.
Article entitled The Role of Chemisorption in Plasma Etching, by Harold F. Winters, IBM Research Laboratory, San Jose, Calif., J. Appl. Phys. 49(10), Oct. 1978, pp. 5165–5170.
Article entitled The Etching of Silicon with XeF$_2$ Vapor by H. F. Winters and J. W. Coburn, IBM Research Laboratory, San Jose, Calif., Appl. Phys. Lett. 34(1), Jan. 1, 1979, pp. 70–73.
Article entitled Ion-surface Interactions In Plasma Etching by J. W. Coburn, H. F. Winters, and T. J. Chuang, IBM Research Laboratory, San Jose, Calif., Journal of Applied Physics, vol. 48, No. 8, Aug. 1977, pp. 3532–3540.
Article entitled Applications of Mass Spectrometers to Plasma Process Monitoring & Control, H. F. Brown, G. B. Bunyard, K. C. Lin, UTI, Sunnyvale, Calif., Solid State Technology/Jul. 1978, pp. 35–38.
Article entitled Applications of Reactive Plasma Practical Microelectronic Processing Systems, Dr. R. L. Maddox, Rockwell International of Strategic Division, Anaheim, Calif., and H. L. Parker, Rockwell International Electronic Device Division, Anaheim, Calif., Solid State Technology/Apr. 1978, pp. 107–113.
Article entitled Spectroscopic Analysis of R.F. Plasmas, W. R. Harshbarger and R. A. Porter, Bell Telephone Laboratories, Inc., Allentown, Pa., Solid State Technology/Apr. 1978, pp. 99–103.
Article entitled Plasma Etching of Aluminum, R. G. Poulsen, H. Nentwich and S. Ingrey, Bell-Northern Research, Ottawa, Canada, pp. 205–208.
Article entitled Plasma Etching of Aluminum, by T. O. Herndon and R. L. Burke, Massachusetts Institute of Technology, Lincoln Laboratory, Lexington, Mass., pp. 33–41.
Article entitled Preferential Lateral Chemical Etching in Reactive Ion Etching of Aluminum and Aluminum Allosy, P. M. Schaible and G. C. Schwartz, IBM Data Systems Division, East Fishkill, Hopewell Junction, New York 12533, J. Vac. Sci. Technol., 16(2), Mar.-/Apr. 1979.
Article entitled Reactive Ion Etching of Aluminum and Aluminum Alloys in an RF Plasma Containing Halogen Species, P. M. Schaible, W. C. Metzger, and J. P. Anderson, IBM System Products Division, East Fishkill, Hopewell Junction, New York 12533, J. Vac. Sci. Technol. 15(2), Mar./Apr. 1978, pp. 334–337.
Article entitled Plasma Etching In Integrated Circuit Manufacture-A Review, R. G. Poulsen, Bell Northern Research, Ottawa, Canada, J. Vac. Sci. Technol., vol. 14, No. 1, Jan./Feb. 1977, pp. 266–274.

*Primary Examiner*—William A. Powell
*Attorney, Agent, or Firm*—Lahive & Cockfield

[57] ABSTRACT

A process for a selective plasma-based reactive ion etching of aluminum and aluminum alloys with silicon and copper, employing gas mixtures having BCl$_3$ as a major constituent and Cl$_2$, SiF$_4$, and O$_2$ as the minor constituents. The major constituent should constitute 40% to 65% by volume of the mixture.

8 Claims, No Drawings

PLASMA REACTIVE ION ETCHING OF ALUMINUM AND ALUMINUM ALLOYS

This is a continuation of application Ser. No. 478,845, filed Mar. 25, 1983, now abandoned.

FIELD OF THE INVENTION

This invention relates in general to fabrication of semiconductor devices and more particularly to a plasma etching technique referred to as selective reactive ion etching of pure aluminum and aluminum alloys containing silicon and copper in the presence of an etch mask, silicon, or silicon oxides.

BACKGROUND THE INVENTION

The manufacturing of semiconductor devices and related thin film circuitry usually involves etching of specific layers comprising the device. Typically, the area to be etched is masked by a material such as photoresist with the mask forming a pattern of lines and areas exposing the layer to be etched. In earlier approaches, the etching was carried out by a wet chemical method in which the etchant material, typically oxidizing mineral acids, contacted the exposed surface.

More recent processes for etching aluminum metalliziations employed gas plasmas, particularly chlorine-based gases selected from the saturated halocarbon series, which eliminate some of the undesirable effects of wet chemicals. However, in both methods the etching was basically isotropic. Additionally, conventional plasmas were incapable of quantitatively removing copper residues after etching a binary or ternary alloy of aluminum containing copper. With isotropic etching, random etching proceeds at a uniform rate in all directions. As the surface to be etched is removed, the etching action takes place not only vertically into the surface, but also horizontally against the edge of the recess created by the etching. Thus, the area to be etched suffers undercutting in which the material is etched not only vertically in line with the edge of the opening in the photoresist mask, but also it extends underneath the photoresist mask. Typically, this undercutting extends horizontally to substantially the same degree as the vertical etching.

As the trend toward miniaturization continues, scaling down to micron and submicron dimensions becomes necessary. This imposes strict demands on etch profiles, with insignificant undercutting. One mode of plasma etching, commonly referred to as reactive ion etching (RIE), produces anisotropic etching as a result of directional effects that suppress isotropic etching. Reactive ion etching combines physical momentum transfer cascade interactions (sputter etching) accomplished by energetic ions, along with chemical reactions normally observed in conventional plasma etching carried out by highly reactive neutral atoms or free radicals. The energetic ions are accelerated across the plasma dark space adjacent to the wafer in a direction perpendicular to the wafer's surface. The relatively low pressures employed during reactive ion etching, in the range of a few microns Hg to 100 microns Hg, substantially eliminate scattering collisions before the ion's impingement vertically on the wafer's surface. This ensures that the sputter etching component of RIE is anisotropic, thereby providing for a vertical etch wall on a plane closely approximating that delineated by the resist edge prior to the etching operation.

As techniques of lithography improve, line patterns of micron and submicron dimensions in photoresist images become possible. In order to effectively etch these patterns on the various substrates, reliable and reproducible anisotropic etching is necessary. Wet chemistry methods cannot effectively etch at these dimensions. With the demand for much smaller dimensions of line width and spaces, the lack of control and reproducibility resulting from undercutting, has made isotropic etching unacceptable.

Present dry plasma chemical etching and reactive ion etching techniques employ conventional chlorine-containing plasmas. While these plasmas, containing boron trichloride/chlorine binary mixtures, can etch anisotropically, they usually leave a residue of nonvolatile silicon and copper-containing compounds when applied to the patterning of aluminum-copper or aluminum-silicon-copper films. These nonvolatiles are highly hygroscopic, a condition that leads to severe and rapid post-etch corrosion of the patterned metal. This copper-rich residue may also be electrically conductive, potentially leading to short-circuited devices.

Another problem associated with very large scale integrated silicon circuits (VLSI) is the desirability that there be a reasonably high selectivity in the etch rate of aluminum metallizations with respect to the etch rate of underlying silicon, silicon oxides, or photoresist etch masks, to provide enough line dimensional control during the etching for the preservation of both the metallized interconnects and the underlayers.

It is therefore a primary object of the present invention to provide a plasma reactive ion etching technique for utilization during semiconductor fabrication in which highly efficient aluminum metallizations etching takes place with a high degree of selectivity, cleanliness, and dimensional control, wherein highly anisotropic etching takes place to provide substantially vertical profiles in the features etched in the metallized layer, where the removal process is primarily due to physical and chemical interactions ensuring complete removal of nonvolatile materials (e.g., copper) from the etched areas, thereby eliminating the requirement for subsequent wet-chemical treatment.

SUMMARY OF THE INVENTION

Broadly speaking, in the present invention, the gas plasma consists essentially of a quarternary mixtures of RF-discharged boron trichloride ($BCl_3$), chlorine ($Cl_2$), silicon tetrafluoride ($SiF_4$), and oxygen ($O_2$), with $BCl_3$ constituting 40-65% by volume, $Cl_2$ constituting 15-30% by volume, $SiF_4$ constituting 10-25% by volume and $O_2$ constituting 2-5% by volume of the mixture employed at relatively low pressures, typically from 1 micron Hg to 60 microns Hg, for highly efficient, controlled, and clean anisotropic etching of pure aluminum and aluminum metallizations containing 2 weight percent Si and 4 weight percent Cu. While $Cl_2$ plasma decomposition products are the entities responsible for etching aluminum metallizations, oxygen additions to the etching mixture are necessary to accentuate their effective concentrations in the gas phase, thereby yielding higher average metal etch rates. These higher etch rates are not brought about by enhancing $Cl_2$ flow rates or partial pressures and therefore will not be accompanied by commonly observed tapering of the etched channel or photoresist undercutting.

The addition of $SiF_4$ to the etching mixture yields active fluorine-containing free radicals responsible for effective removal of silicon residues during etching of binary and ternary alloys of aluminum. Also, these fluorine-bearing radicals seem to effectively sputter off copper residues from base layers underlying copper-alloyed aluminum, as well as providing for in situ photoresist passivation during etching, thereby substantially reducing resist erosion rates commonly observed during aluminum etching. The latter advantage practically eliminate the need for similar post etch resist treatments for the quenching of aluminum corrosion upon exposure to the atmosphere.

The process is highly selective with respect to silicon, silicon oxides and common positive resist etch masks. It produces substantially vertical etched profiles for features in the range of submicron to a few microns (typically one to four microns). This etching technique may be employed with both batch and continuous systems for the processing of semiconductor devices. The above-mentioned restrictions on the percentage of the various gaseous components relate to deviations from optimum etching performance with the four-component gas mixture. For example, enhancement of $BCl_3$ flowrates, with all other parameters maintained at optimum values, will commonly reduce average etch rates for the metallization and increase somewhat resist erosion rates. Enhancing the flowrate of $Cl_2$, while increasing average etch rates for the metallizations, will increase resist erosion rates, reduce anisotropy, increase line width loss, and reduce base layer cleanliness. Enhancing $SiF_4$ flowrates will normally reduce average etch rates for the metallizations, while resist erosion rates will be decreased, anisotropy will be enhanced, line width loss will be decreased, and overall cleanliness of the base layer will be enhanced. Enhancing $O_2$ flowrates, for otherwise constant and optimum parameter values, although enhancing average etch rates for the metallizations, will increase resist erosion rates, decrease anisotropy, increase line width loss, and reduce overall cleanliness of the base layer.

Adverse polymerization reactions competing with the etching process are practically eliminated, as are depositions of organic layers that may act as undesired masks on the workpiece to be etched due to the exclusion of any carbon containing reactants in the gaseous etching mixture.

DESCRIPTION OF PREFERRED EMBODIMENTS

A suitable apparatus for use in the practice of this invention has been previously described in U.S. Pat. No. 4,298,443, but it is not restricted by the geometric configurations described herein. For example, the multifaceted cathode can be positioned within a conductive polygonal sided chamber (such as a four-sided chamber) rather than a cylindrical chamber.

In operation, the substrates to be etched, which typically have sublayers of either thermally grown silicon oxides, or CVD phosphosilicate glass, are overlaid with a positive-photoresist patterned layer of pure aluminum or alloys of aluminum with silicon and copper metallizations, and are placed on a temperature controlled multifaceted 'cathode' which is maintained at 40°-50° C., and is connected to a RF source via capacitive coupling. The enclosing chamber, housing the multifaceted cathode, is commonly maintained at ground potential. The reaction chamber is evacuated to a base pressure of approximately $10^{-4}$ torr with the aid of cryogenic and turbomolecular pumps, at which point the quaternary etchant mixture is introduced. When the appropriate pressure of the etchant gas is obtained, usually in the range 1 to 60 microns Hg, the RF discharge is initiated and the etching reaction is commenced and allowed to proceed to completion. The etching end point for completion can be determined visually or by means of laser interferometry, or by characteristic chemiluminescent emissions. In order to ensure quantitative removal of any metallic or nonmetallic residue, the discharge is allowed to continue beyond this point, for a prescribed period of time, commonly referred to as the overetching period. When attained, the discharge and gas flow are stopped and the system is allowed to pump down to the base pressure.

After wafers are withdrawn, the device patterns, for which the width of lines and spaces had been measured prior to etching, are reexamined after removal of the photoresist to determine the dimensional control during etching. These comparative measurements yield data pertaining to etching resolution that could be accomplished with this process. In other experiments, etch profiles were examined after etching, but before photoresist was removed, by cleaving the sample and examining it with a scanning electron microscope. The electron microscope and attached X-ray dispersive accessories were also employed for the scrutiny of the cleanliness of the base layer. For the latter purpose, overall magnifications in the range 20,000 to 35,000X were used.

TABLE 1

| $BCl_3$ Flow (SCC/M) | $BCl_3$ Press. (μHG) | $Cl_2$ Flow (SCC/M) | $Cl_2$ Press. (μHg) | $SiF_4$ Flow (SCC/M) | $SiF_4$ Press. (μHg) | $O_2$ Flow (SCC/M) | $O_2$ Press. (μHg) | Total Press. (μHg) | RF Pwr. (W) | DC Bias (Volt) | Metal. Etch Rate (A/M) | Resist Etch Rate (A/M) | Base Layer (Cleanliness) |
|---|---|---|---|---|---|---|---|---|---|---|---|---|---|
| PURE ALUMINUM | | | | | | | | | | | | | |
| 70 | 7.56 | 50 | 5.32 | — | — | — | — | 14 | 475 | −200 | 968 | 288 | Clean |
| 90 | 18.0 | 50 | 10.0 | — | — | — | — | 27 | 800 | −217 | 1934 | 689 | Clean |
| 115 | 17.5 | 50 | 7.76 | — | — | — | — | 27 | 800 | −228 | 2251 | 775 | Clean |
| 114 | 29.1 | 30 | 5.7 | — | — | — | — | 36 | 800 | −200 | 1127 | — | Clean |
| 114 | 29.1 | 50 | 10.2 | — | — | — | — | 36 | 800 | −175 | 2239 | — | Clean |
| 70 | 26.8 | 20 | 8.6 | 15 | 7.3 | 5 | 1.27 | 40 | 1060 | −260 | 710 | 223 | Clean |
| ALUMINUM/SILICON (2%) | | | | | | | | | | | | | |
| 120 | 29.1 | 20 | 7.64 | 20 | 6.8 | 5 | 1.7 | 40 | 1060 | −260 | 1166 | 464 | Clean |
| 110 | 28.47 | 20 | 6.40 | 20 | 7.14 | 5 | 1.0 | 40 | 1060 | −240 | 1200 | 481 | Clean |
| 70 | 25.40 | 20 | 8.49 | 20 | 9.50 | 5 | 1.38 | 40 | 1060 | −240 | 1225 | 523 | Clean |
| 70 | 20.85 | 20 | 6.90 | 10 | 4.0 | 5 | 1.11 | 30 | 1060 | −250 | 940 | — | Clean |
| 70 | 19.84 | 25 | 8.09 | 10 | 3.77 | 5 | 1.06 | 30 | 1060 | −255 | 1648 | — | Some Particles |

TABLE 1-continued

| BCl$_3$ Flow (SCC/M) | BCl$_3$ Press. ($\mu$HG) | Cl$_2$ Flow (SCC/M) | Cl$_2$ Press. ($\mu$Hg) | SiF$_4$ Flow (SCC/M) | SiF$_4$ Press. ($\mu$Hg) | O$_2$ Flow (SCC/M) | O$_2$ Press. ($\mu$Hg) | Total Press. ($\mu$Hg) | RF Pwr. (W) | DC Bias (Volt) | Metal. Etch Rate (A/M) | Resist Etch Rate (A/M) | Base Layer (Cleanliness) |
|---|---|---|---|---|---|---|---|---|---|---|---|---|---|
| 120 | 29.01 | 20 | 5.88 | 20 | 6.58 | 7 | 1.27 | 40 | 1060 | −270 | 1309 | 497 | Some Particles |
| 120 | 29.14 | 20 | 6.00 | 20 | 6.65 | 5 | 0.87 | 40 | 1060 | −260 | 1160 | 469 | Clean |
| 70 | 26.93 | 20 | 8.87 | 15 | 7.62 | 5 | 1.48 | 40 | 1060 | −260 | 1143 | — | Clean |
| 70 | 25.28 | 20 | 8.38 | 30 | 9.39 | 5 | 1.39 | 40 | 1060 | −240 | 1225 | — | Clean |
| 70 | 24.40 | 20 | 8.08 | 25 | 11.25 | 5 | 1.30 | 40 | 1060 | −250 | 1111 | — | Clean |
| 70 | 26.65 | 20 | 8.33 | 15 | 7.15 | 5 | 1.18 | 40 | 1200 | −270 | 1181 | 457 | Clean |
| 70 | 26.65 | 20 | 8.33 | 15 | 7.15 | 5 | 1.18 | 40 | 1050 | −240 | 1096 | 378 | Some Particles |
| 70 | 26.79 | 20 | 8.50 | 15 | 7.29 | 5 | 1.30 | 40 | 1060 | −260 | 782 | 291 | Clean |
| 70 | 20.00 | 20 | 6.30 | 15 | 5.30 | 5 | 0.80 | 30 | 800 | −260 | 826 | 353 | Some Particles |
| ALUMINUM/SILICON (2%)/COPPER (4%) | | | | | | | | | | | | | |
| 70 | 21.21 | 20 | 7.63 | 15 | 5.65 | 6 | 1.12 | 33 | 1060 | −270 | 940 | 362 | Clean |
| 60 | 20.07 | 20 | 8.39 | 15 | 6.26 | 6 | 1.23 | 33 | 1060 | −270 | 987 | 288 | Clean |
| 70 | 18.92 | 20 | 6.06 | 20 | 6.83 | 5 | 0.86 | 30 | 1060 | −270 | 701 | 301 | Clean |
| 70 | 18.29 | 23 | 6.56 | 20 | 6.47 | 5 | 0.72 | 30 | 1060 | −270 | 743 | 303 | Clean |
| 70 | 17.88 | 26 | 7.06 | 20 | 6.10 | 5 | 0.46 | 30 | 1060 | −300 | 804 | 290 | Some Particles |
| 60 | 21.40 | 23 | 8.87 | 10 | 4.41 | 5 | 1.13 | 33 | 1060 | −260 | 801 | 217 | Clean |
| 60 | 21.34 | 23 | 8.96 | 10 | 4.53 | 6 | 1.53 | 33 | 1060 | −260 | 77 | 309 | Some Particles |
| 60 | 21.15 | 23 | 8.78 | 10 | 4.36 | 7 | 1.72 | 33 | 1060 | −260 | 1417 | 488 | Some Particles |
| 60 | 21.40 | 23 | 8.87 | 10 | 4.41 | 5 | 1.13 | 33 | 1060 | −260 | 801 | 217 | Clean |
| 60 | 20.38 | 23 | 8.50 | 15 | 6.29 | 5 | 1.22 | 33 | 1060 | −260 | 759 | 305 | Clean |
| 60 | 17.36 | 23 | 7.08 | 20 | 6.95 | 5 | 0.69 | 30 | 1060 | −280 | 747 | 241 | Clean |
| 70 | 19.04 | 20 | 6.19 | 20 | 6.94 | 5 | 1.0 | 30 | 1060 | −280 | 845 | 433 | Clean |
| 70 | 19.05 | 20 | 6.18 | 20 | 6.88 | 5 | 1.03 | 30 | 900 | −250 | 1498 | — | Some Particles |
| 60 | 22.55 | 23 | 9.40 | 10 | 4.75 | 6.5 | 1.71 | 35 | 1060 | −270 | 1083 | 363 | Some Particles |
| 60 | 21.20 | 23 | 8.89 | 10 | 4.45 | 6.5 | 1.58 | 33 | 1060 | −270 | 928 | 273 | Some Particles |

Table 1 represents the etching results obtained with the aforementioned quarternary gas mixtures. As illustrated, the average etch rates range from about 800 to 1500 Å/min for aluminum alloys containing silicon or silicon and copper, while average etch rates for pure aluminum in the range 700 to 2200 Å/min have been observed. Corresponding etch rate selectivities of metallization-to-photoresfst (Shipley AZ 1470) in the range 2 to 3.5 have been recorded.

An increase in total pressure, for otherwise constant and optimum process parameters, commonly enhanced the average etch rate for the metallizations, while selectivity with respect to photoresist deteriorated, as did the antisotropy and the overall cleanliness of the base layer.

RF power enhancement typically increased resist erosion rates relative to etch rates of the metallizations, resulting in adverse selectivities and enhanced line width loss. This behavior was also manifested during the enhancement of the DC offset voltage on the multifaceted electrode carrying the wafers.

The etching produced a substantially vertical (anisotropic) etched profile with 0.2 to 0.4 microns line width loss sensitively dependent upon the type and processing of the resist etch mask, and the amount of overetching required to render a clean base layer.

Typically, the longer overetch periods were employed with the ternary aluminum alloys containing 2% silicon and 4% copper by weight.

The following are specific examples of conditions and material which provided satisfactory results using a reactor apparatus generally as described in U.S. Pat. No. 4,298,443.

EXAMPLE 1

Material to be etched was sputtered pure aluminum. The relative proportions of the quaternary gas mixture were BCl$_3$-61%, Cl$_2$-19%, SiF$_4$-17%, and O$_2$-3%. The partial pressures were 26.8 ($\mu$Hg) for BCl$_3$, 8.6 ($\mu$Hg) for Cl$_2$, 7.3 ($\mu$Hg) for SiF$_4$, and 1.27 ($\mu$Hg) for O$_2$. With RF power of 1060 watts the metal was etched at 710 Å/min., with a resist etch rate of 223 Å/min. The resultant base layer was clean.

EXAMPLE 2

Material to be etched was an electron beam evaporated alloy of aluminum and silicon (2%). The relative proportions of the quaternary gas mixture were BCl$_3$-64%, Cl$_2$-17%, SiF$_4$-15%, and O$_2$-4%. The partial pressures were 29.1 ($\mu$Hg) for BCl$_3$, 7.6 ($\mu$Hg) for Cl$_2$, 6.8 ($\mu$Hg) for SiF$_4$, and 1.7 ($\mu$Hg) for O$_2$. With RF power of 1060 watts the metal was etched at 1166 Å/min, with a resist etch rate of 464 Å/min. The resultant base layer was clean.

EXAMPLE 3

Material to be etched was a sputtered alloy of aluminum and silicon (2%). The relative proportions of the quarternary gas mixture was $BCl_3$-61%, $Cl_2$-19%, $SiF_4$-17%, and $O_2$-3%. The partial pressures were 26.8 ($\mu$Hg) for $BCl_3$, 8.5 ($\mu$Hg) for $Cl_2$, 7.3 ($\mu$Hg) for $SiF_4$, and 1.30 ($\mu$Hg) for $O_2$. With RF power of 1060 watts the metal was etched at 782 Å/min, with a resist etch rate of 291 Å/min. The resultant base layer was clean.

EXAMPLE 4

Material to be etched was a sputtered alloy of aluminum/silicon (2%)/copper (4%). The relative proportions of the quaternary gas mixture were $BCl_3$-58%, $Cl_2$-18%, $SiF_4$-21%, and $O_2$-3%. The partial pressures were 18.9 ($\mu$Hg) for $BCl_3$, 6.06 ($\mu$Hg) for $Cl_2$, 6.8 ($\mu$Hg) for $SiF_4$, and 0.86 ($\mu$Hg) for $O_2$. With RF power of 1060 watts the metal was etched at 701 Å/min., with a resist etch rate of 301 Å/min. The resultant base layer was clean.

While the invention has been described in conjunction with a specific family of multifaceted cathode-based apparatus, it will be understood that a variety of reactors, some of which are commercially available, may be employed satisfactorily with the disclosed four-component etching mixture. Different etching modes, including physically-based etching, such as reactive ion beam etching, or reactive ion milling, should be possible to accomplish with the four component gaseous etching mixtures described herein.

We claim:

1. A process for selective reactive ion etching of thin films of aluminum and aluminum alloys in the presence of an etch mask, within a reaction chamber, comprising the step of:

exposing said aluminum metallization within the chamber to a gas plasma for etching, wherein said gas plasma consists essentially of a quarternary mixture of boron trichloride ($BCl_3$) as a major constituent and chlorine ($Cl_2$), silicon tetrafluoride ($SiF_4$), and oxygen ($O_2$) as the minor constituents, wherein said $BCl_3$ constitutes 40 to 65% by volume of the mixture, $Cl_2$ constitutes 15 to 30% by volume, $SiF_4$ constitutes 10–25% by volume, and $O_2$ constitutes 2 to 5% by volume of the mixture.

2. A process in accordance with claim 1 wherein said gas plasma is at a pressure between 10 and 60 microns Hg.

3. A process in accordance with claim 1 wherein said etchant gas is at a pressure of between 10 and 60 microns Hg and where RF power is supplied to said gas plasma at a rate between 0.075 and 0.188 watts per centimeter square of power density.

4. A composition of matter for selective etching of pure aluminum material consisting essentially of a quaternary mixture of boron trichloride ($BCl_3$) as a major constituent and chlorine ($Cl_2$), silicon tetrafluoride ($SiF_4$), and oxygen ($O_2$) as the minor constituents, wherein said $BCl_3$ constitutes 40 to 65% by volume of the mixture, $Cl_2$ constitutes 15 to 30% by volume, $SiF_4$ constitutes 10–25% by volume, and $O_2$ constitutes 2 to 5% by volume of the mixture.

5. A process for selective reactive ion etching of thin films of sputtered metal aluminum in the presence of an etch mask, within a reaction chamber, comprising the step of:

exposing said aluminum metallization within the chamber to a gas plasma for etching, wherein said gas plasma consists essentially of a quarternary mixture of boron trichloride ($BCl_3$) as a major constituent and chlorine ($Cl_2$), silicon tetrafluoride ($SiF_4$), and oxygen ($O_2$) as the minor constituents, wherein said $BCl_3$ constitutes substantially 61% by volume of the mixture, $Cl_2$ constitutes substantially 19% by volume, $SiF_4$ constitutes substantially 17% by volume, and $O_2$ constitutes substantially 3% by volume of the mixture.

6. A process for selective reactive ion etching of thin films of electron beam evaporated aluminum/silicon alloys in the presence of an etch mask, within a reaction chamber, comprising the step of:

exposing said aluminum alloy metallization within the chamber to a gas plasma for etching, wherein said gas plasma consists essentially of a mixture of boron trichloride ($BCl_3$) as a major constituent and chlorine ($Cl_2$), silicon tetrafluroide ($SiF_4$), and oxygen ($O_2$) as the minor constituents, wherein said $BCl_3$ contitutes substantially 64% by volume of the mixture, $Cl_2$ constitutes substantially 17% by volume, $SiF_4$ constitutes substantially 15% by volume, and $O_2$ constitutes substantially 4% by volume of the mixture.

7. A process for selective reactive ion etching of thin films of a sputtered aluminum/silicon alloy in the presence of an etch mask, within a reaction chamber, comprising the step of:

exposing said aluminum metallization within the chamber to a gas plasma for etching, wherein said gas plasma consists essentially of a mixture of boron trichloride ($BCl_3$) as a major constituent and chlorine ($Cl_2$), silicon tetrafluoride ($SiF_4$), and oxygen ($O_2$) as the minor constituents, wherein said $BCl_3$ constitutes substantially 61% by volume of the mixture, $Cl_2$ constitutes substantially 19% by volume, $SiF_4$ constitutes substantially 17% by volume, and $O_2$ constitutes substantially 3% by volume of the mixture.

8. A process for selective reactive ion etching of thin films of a sputtered alloy of aluminum/silicon/copper in the presence of an etch mask, within a reaction chamber, comprising the step of:

exposing said aluminum metallization within the chamber to a gas plasma for etching, wherein said gas plasma consists essentially of a mixture of boron trichloride ($BCl_3$) as a major constituent and chlorine ($Cl_2$), silicon tetrafluoride ($SiF_4$), and oxygen ($O_2$) as the minor constituents, wherein said $BCl_3$ constitutes substantially 58% by volume of the mixture, $Cl_2$ constitutes substantially 15% by volume, $SiF_4$ constitutes substantially 21% by volume, and $O_2$ constitutes substantially 3% by volume of the mixture.

* * * * *